United States Patent [19]
Bergmann et al.

[11] Patent Number: 5,238,546
[45] Date of Patent: Aug. 24, 1993

[54] METHOD AND APPARATUS FOR VAPORIZING MATERIALS BY PLASMA ARC DISCHARGE

[75] Inventors: Erich Bergmann, Mels; Helmut Rudigier, Bad Ragaz, both of Switzerland

[73] Assignee: Balzers Aktiengesellschaft, Furstentum, Liechtenstein

[21] Appl. No.: 935,639

[22] Filed: Aug. 25, 1992

Related U.S. Application Data

[63] Continuation of Ser. No. 661,545, Feb. 26, 1991, abandoned.

[30] Foreign Application Priority Data

Mar. 1, 1990 [DE] Fed. Rep. of Germany ....... 4006456
Mar. 1, 1990 [DE] Fed. Rep. of Germany ....... 4006458

[51] Int. Cl.⁵ .............................................. C23C 14/22
[52] U.S. Cl. .............................. 204/192.38; 204/298.41; 427/580; 427/596; 118/723
[58] Field of Search .............. 204/192.38, 298.41; 427/37, 38, 572, 580, 596; 118/723, 724

[56] References Cited

U.S. PATENT DOCUMENTS

| | | | |
|---|---|---|---|
| 3,793,179 | 2/1974 | Sablev et al. | 204/298.41 |
| 4,197,175 | 4/1980 | Moll et al. | 204/298.41 X |
| 4,448,802 | 5/1984 | Buhl et al. | 204/298.41 X |
| 4,620,913 | 11/1986 | Bergman | 204/298.41 X |
| 4,740,386 | 4/1988 | Cheung | 427/53.1 |
| 4,919,968 | 4/1990 | Buhl et al. | 204/297.41 X |
| 4,987,007 | 1/1991 | Wagal et al. | 427/53.1 |

FOREIGN PATENT DOCUMENTS

| | | | |
|---|---|---|---|
| 257451 | 6/1988 | Fed. Rep. of Germany | 204/298.41 |
| 3801957 | 11/1988 | Fed. Rep. of Germany | 204/298.41 |
| 267464 | 11/1987 | Japan | 204/298.41 |

Primary Examiner—Nam Nguyen
Attorney, Agent, or Firm—Notaro & Michalos

[57] ABSTRACT

In order to ignite a vaporizing arc on a target which includes at least at its surface a material of a high melting point to be vaporized, and to stabilize and guide same, an electron beam gun or a laser is forseen for generating of a local vapor cloud or a premelted spot on the surface of the target in order to therewith ignite and guide the arc spot.

16 Claims, 2 Drawing Sheets

METHOD AND APPARATUS FOR VAPORIZING MATERIALS BY PLASMA ARC DISCHARGE

This application is a continuation of application Ser. No. 07/661,545, filed Feb. 26, 1991, abandoned.

BACKGROUND OF THE INVENTION

1. Field of the Invention

The present invention relates to an apparatus for vaporizing a material at vacuum conditions by means of an arc with a target which includes at least at a part of its surface a material to be vaporized. The discharge is made to proceed in an area where a substantial part of the arc current flows mostly through small spots at the surface of the target. The invention also includes an apparatus for igniting the vaporizing arc and a method of vaporizing material in a vacuum by means of an arc at a target wired as a cathode, which target includes at least at a portion of its surface a material to be vaporized. The arc discharge is performed within an area where a substantial part of the arc flow flows mostly through small spots at the surface of the target. The invention also involves a method of igniting the arc a plasma arc arrangement for depositing coatings onto a substrate by means of an apparatus and an application of the method for a vapor depositing onto substrates by means of a plasma arc.

2. Description of the Prior Art

Methods and apparatuses for a depositing of coatings of materials having a relatively high melting temperature by a depositing of a material which has been vaporized by means of an electric arc are known and disclosed in great variety.

The German published patent application DE-OS 21 36 532 discloses an apparatus in which an electric arc is generated between a jacket shaped anode and a cathode mounted on a cooling bed, whereby the cathode includes on its surface a metal to be vaporized. By means of attaching a screen to the cathode it is sought to prevent the cathode spot produced on the cathode from laterally flashing from the vaporization surface. The basic difficulty of this apparatus is that due to the random unguided straying across of the cathode spot the surface of the cathode is eroded in an irregular manner and, furthermore, due to a local overheating, sputtering is produced continuously. This leads to disturbances on the coating to be produced or in the coating, itself. U.S. Pat. No. 3 625 848 discloses an analogue apparatus whereby the cathode is made of the coating material which is to be vaporized. This apparatus incorporates basically the same drawbacks which are featured by the apparatus according to mentioned DE-OS 21 36 532.

In the apparatus according to the U.S. Pat. No. 4,556,471 the attempt is made to influence by means of a magnetic field or by a mounting of a permanent magnet the arc regarding its straying, to such an extent that the surface of the cathode or the so-called target, is eroded substantially regularly. Thereby the cathode is additionally arranged to be insulated relative to the vacuum chamber. Basically, however, the arc spot still moves uncontrollably and randomly on the cathode wherewith the described drawbacks are eliminated only in part and the danger of sputtering still remains. The U.S. Pat. No. 4,620,913 discloses an apparatus in which the straying or flashing of the spot from the cathode is sought to be prevented by means of a specific arrangement of the cathode. The DE-OS 35 28 677 attempts also by an arranging of arc limiting means to prevent the arc spot from straying, whereby here additionally the spot shall incorporate a controlled movement on the cathode by mounting a source of a magnetic field. Due to the pulsed generation of the magnetic field and depending on its polarity the spot is caused to move toward or away from the magnetic field. This is only a relatively directional, but not a basic guiding of the spot such that—albeit somewhat reduced—the danger of a local overheating and accordingly a sputtering is not completely obviated. Also, no successful realization of such a system has been achieved.

In the DE-OS 33 45 493 a straying of the spot is again prevented by means of arranging a limiting ring at the cathode, but without an influencing of the random movement of the spot of the arc. Also the DE-PS 33 45 442 claims the arranging of a limiting ring of a magnetically permeable material.

In the DE-OS 31 52 131 a magnetic field is generated in the vacuum chamber by means of a so-called solenoid. This magnetic field causes a moving of the spot of the cathode ray. Further, an ignition impulse generator for a continuous igniting of cathode ray spots is forseen, which then move toward a surface due to the magnetic field. The spot is, however, basically not controlled, but rather caused merely to move by the random generator along the surface of the cathode toward the surface.

The CH-PS 657 242 describes how the sputtered or macro particles which have formed are precipitated in the plasma. A so-called plasma guide means and a coaxially mounted electro-magnet are arranged which latter is switched opposite to a focussing solenoid. Accordingly, a specific magnetic field is generated which divertes the plasma beam such that sputtered or macro particles contained in the beam are driven out of the plasma guide means. This diverting, however, causes high losses of material. Furthermore, the diverting mechanism, which is coated much stronger than the substrates must be cleaned continuously, which necessitates a high expenditure and considerable inconvenience. Corresponding matter is claimed in the French disclosure FR-A 2 524 254. The DE-PS 32 34 100 relates basically to the subjects of the two aforementioned documents, whereby additionally modifications of the apparatus are proposed in order to secure a more even coating of a workpiece. These, however, have in no way a bearing on the guiding of the spot on the surface of the cathode.

In the DE-OS 37 31 127 an arc is operated in a pulsed manner, i.e. the temperature of the substance is compared with an upper temperature limit, or the arc is interrupted when exceeding this upper limit. This prevents a local overheating at the surface of the cathode. Sputtering which occurs in spit of this is diverted by means of a magnetic field/screening sheet, i.e. the pulsing represents a quite unsufficient solution. Screening by means of a magnetic field and orifices are, however, uneconomical because they cause high expenditures in maintenance and greatly influence the speed of the coating in a negative manner. The described method is specifically suitable for decorative coatings and less for coatings in the technical field.

In the U.S. Pat. No. 3,673,477 a cathode spot is guided by means of a permanent magnet. The anode is or a ring-like design and the cathode is designed as a disk located parallel and staggered relative to the plain of the disk. A magnet is located behind the cathode, by means of which magnet the cathode spot is moved on the surface of the cathode. Although a reduction of the sputtering is caused by this arrangement, the design must again be judged as being complicated.

In the European specification EP-A 0 284 145 the anode is of an annular shape and the cathode is arranged staggered parallel to the plain of the annulus and designed as a cylinder which is rotatable around its axis. In order to prevent an arbitrary moving of the cathode spot a magnet arrangement is forseen which is displaceably located inside of the cathode cylinder. By means of a rotating of the cylinder and a longitudinal displacing of the magnet, the cathode spot is guided on the surface in order to prevent sputtering. The suggested arrangement encompasses an extremely complicated design usable for practical applications.

Both above described cases have shown, furthermore, that the reduction of sputtering depend very strongly on the material of the cathode, whereby they are quite unsufficient for material which are of interest in practical operations, such as for instance, titanium.

SUMMARY OF THE INVENTION

A general object of the invention is to provide a method and apparatus by means of which a spark or arc spot, is applied, stabilized and controlled for the vaporizing of a coating material in order to overcome the drawbacks of a non controlled and not guided spark or spot such as extensively illustrated above. The construction and the method shall additionally be as simple as possible and possibly lend itself to be incorporated into existing apparatuses.

A further object is to provide an apparatus for vaporizing a material at vacuum conditions by means of an arc which comprises additionally an electron beam cathode or a laser, for the producing of a local vapor cloud on the surface of the target and means for guiding the beam of electrons or of the laser beam, over the surface of the target in order to stabilize and guide the foot point of the arc.

Still a further object is to provide a method of vaporizing material in a vacuum by means of an arc, in which a local vapor cloud is produced by means of an electron beam or laser, at the surface of a target such that the foot point of the arc or of the spark, is stabilized in this vapor cloud.

The target is, thereby, preferably the cathode of the spark or arc.

Yet a further object is to provide an apparatus and a method designed such that the electron beam or laser beam is guidable on the surface of the target and for instance to mount the objective lens of the laser in a moveable manner or further to provide a mirror which is mounted in a moveable manner for the moving of the focal point. Simultaneously with the guiding of the electron beam or laser beam, the spot of the arc is guided on the surface of the cathode in that it follows the local vapor cloud generated by the electron beam or laser beam at the surface of the target.

A further large problem which is common to all the various vacuum evaporating apparatus and methods, belonging to the prior art, is the igniting of a spark or arc. To this end it is proposed in the DE-OS 34 13 728 for instance, to ignite the arc in that a contact bar or an arc igniting bar which at the one hand contact the surface of the cathode and at the other hand is connected to the power source for a generating of the arc are moved away from the cathode surface. When the igniting bar contacts the surface of the cathode a closed current circuit is established. When the igniting bar is moved away an arc jumps from the wire onto the cathode. This arc jumps then immediately over onto the anode and accordingly is ignited. The pneumatically controlled construction for the guiding of an igniting bar toward the surface of the cathode and away therefrom as described in this DE-OS 34 13 728 is complicated and obviously quite prone to malfunctions.

The EP-A-0 211 413 describes an annular igniting apparatus which is arranged around the cathode. A small gap is present between the inner edge of the ignition ring and the surface of the target which for a producing of a closed electrical circuit is connected via a thin film consisting for instance of titanium-nitride. During the igniting operation this thin film is partly evaporated and the accordingly ionized material allows a jumping of the arc from the anode onto the cathode. During the subsequent coating operation of a substrate the film is formed anew.

Also this design must be judged as being complicated and specifically due to the continuous evaporating and redepositing process of the thin film it is also quite prone to malfunctions.

In the DE-OS 35 16 598 the arc is ignited mechanically by use of a lever arm which is supported in a harmonica shaped structure. This design, which is like the one in the DE-OS 34 13 728 is also quite complicated and prone to malfunctions.

In the U.S. Pat. No. 4,612,477 the igniting of the arc proceeds electrically by use of a so-called triggering electrode which is connected such to a spark bridging circuit in a way such that a sparking between trigger electrode and the cathode happens in predetermined time intervals. These respective interruptions of the voltage lead to the igniting of the arc between the cathode and the anode. Specifically the design of the circuit is extremely complicated.

The igniting of the spark according to the U.S. Pat. No. 4,673,477 is made in an analogous manner also electrically by a high voltage ignition device. Also this design is complicated and, furthermore, quite often difficulties occur at the separation between the two discharges.

It is, therefore, still a further object of the invention to provide an apparatus and a method according to which the igniting of a spark or light arc is achieved in a simple and as much as possible disturbance-free manner.

Yet a further object is to provide an apparatus in which the electron beam gun or the laser for the producing of a pre-melted spot or the forming of a local vapor cloud, is forseen over a small area of the target surface which is sufficient for the igniting of the arc.

Still a further object is to provide an apparatus for igniting a spark or vaporizing arc which is used together with the conventional electron beam-vaporizing source or a suitable laser beam, where thereby the surface of the target which is wired as electrode of a spark source is by means of the electron or laser beam, melted locally or over the entire area or a local vapor cloud is generated above a small area of the surface of the target resp. and where by means of an impulse ionization of the vaporizing material by the electrons of the electron or laser beam a partial ionization of the vapor is arrived at. Such is sufficient for the ignition of the spark by application of a no-load voltage between the two electrodes of the spark or arc.

Still a further object is to provide an apparatus comprising a laser optic having a focal length exceeding 40 millimiters.

Yet a further object is to provide an apparatus comprising a pulsed laser for the igniting of the light arc.

A further object is to provide a method of vaporizing a material by means of an arc at a target under vacuum conditions whereby the target includes at least at its surface a material to be vaporized which is wired as part of an arc discharge and whereby the arc discharge is operated in an area where a substantial part of the current of the arc flows through small spots on the surface of the target, in that a local vapor cloud is generate by means of an electron beam or a laser, and specifically such that the foot point of the arc or spark, is stabilized in this vapor cloud and is guided therewith. It is thereby additionally possible to produce a puddle on the surface of the target below the vapor cloud.

A further object is to provide an apparatus and a method by means of which the electron or laser beam may be guided on the surface of the target to guide the arc or spark foot point on the surface of the target, whereby the guiding of the electron beam or laser beam can proceed obviously in accordance with a preset pattern according to which a regular eroding of the surface of the target by means of the guided arc or spark spot is guaranteed.

Still a further object is to provide a method operated such that, taken at a mean time span, the operational output of the arc discharge exceeds the operational output of the electron beam or of the laser and the vaporizing of the material at the surface of the target occurs predominantly by means of the arc discharge.

Yet a further object is to provide a method in which the energy density of the electron beam or laser beam is controlled such that a discharge current of more than 30 amperes at a discharge voltage of merely 10 to 15 volts is made possible.

A further object is to provide a method in which a thinned atmosphere of an inert gas, oxygen, nitrogen, a gaseous carbon compound, a metal-organic gaseous or boron containing compound is maintained in the vaporizing space located above the target.

Yet a further object is to provide a method, in case the surface of the target contains an easy melting material, in which the electron beam or laser beam is defocussed to such an extent that the puddle around the foot point of the arc of the arc discharge forms continuously a funnel whereby liquid target material flows repeatedly in the bottom thereof, wherewith the arc is stabilized, without a guiding.

Still a further object is to provide a method in which the movement of the electron beam or laser focal point occurs at such a high speed that the movement proper of the foot point of the arc discharge, which preferably is a cathode foot point, is suppressed.

Yet a further object is to provide an apparatus which is specifically suitable for an application in a plasma arrangement for depositing of coatings on a substrate.

A further object is to provide a method of igniting the vaporizing arc at the target by means of an electron beam or a laser in that a pre-melted spot is generated on the surface of the target or a local vapor cloud is generated over a small area of the surface of the target, which is sufficient for the igniting of a spark or the arc.

A further object is to provide a method in which the size of the spot of ignition is selected, where using an electron beam of less than 10 square millimeters, to be preferably less than 1 square millimeter, or where using a laser of less than 0.3 square millimeters, to be preferably less than 0.1 square millimeters.

Still a further object is to provide a method in which the igniting of the arc is repeated in an at least approximately regular manner.

A further object is to provide a method of vapor depositing onto substrates by means of a plasma light-arc under high vacuum conditions.

Still a further object is to provide a method of producing coatings consisting of oxides, nitrides, oxynitrides, borides, carbides and fluorides for optical applications by a vaporizing of an element or a compound of a corresponding element of the groups 2a, 3a, 3b, 4a, 4b, 5a, 6a in a corresponding atmosphere of a reactive gas.

BRIEF DESCRIPTION OF THE DRAWINGS

The present invention will be better understood and objects other than those set forth above will become apparent when consideration is given to the following detailed description thereof when read in conjunction with the appended drawings, wherein.

DESCRIPTION OF A PREFERRED EMBODIMENT

Figure 1:
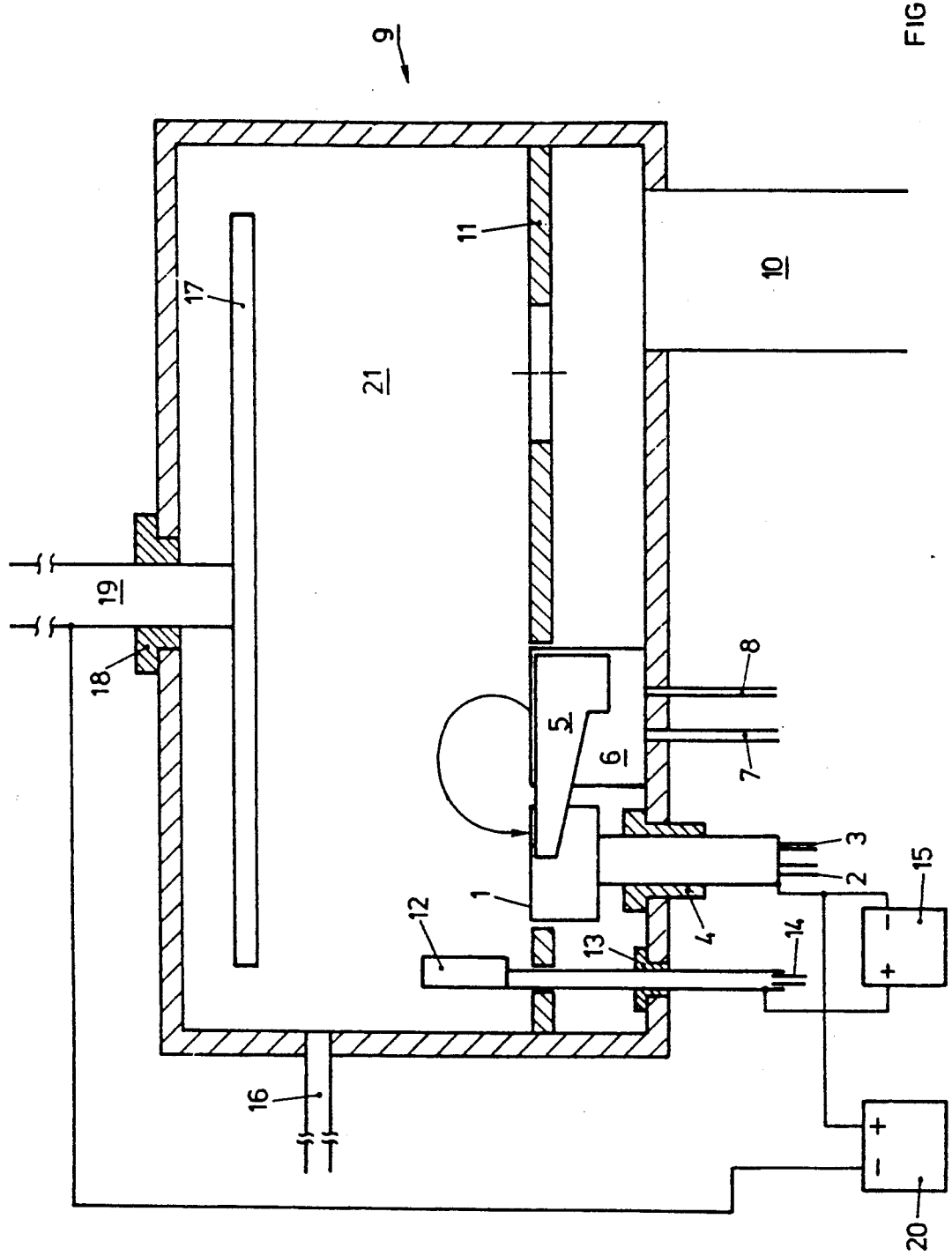
FIG. 1 is an illustration of a high vacuum apparatus having a spark discharge arrangement and an electron gun.

A conventional electron gun 6 is mounted in a high vacuum apparatus 9 having a corresponding pumping opening 10 for the evacuating of the vacuum apparatus 9 which gun 6 is cooled by a water cooling circuit 7, 8. The electron gun 6 is arranged such that an electron beam emitted from the electron gun is guided by the pole shoes of an electromagnet 5 to impact on the rotating target 1 mounted by means of an insulator 4 insulated against the bottom of the apparatus, which target 1 is also cooled by a water cooling circuit 2, 3.

The target 1 acts simultaneously as cathode of the spark discharge. This spark discharge includes a water cooled anode 12 having a water cooling circuit 14 and which is insulated against the apparatus by an insulator 13. In an exemplary embodied apparatus the anode 12 has the dimensions of 30×10 centimeters and is mounted at a distance of about 10 centimeters from the target 1.

A intermediate floor 11 acts as pressure stage for the case when reactive or inert gases are fed in via a gas inlet 16 such that the pressure in the charging chamber 21 does exceed the maximal allowable pressure for the electron gun.

The circuit 15 symbolizes the power supply of the spark whereby such can for instance be a high current generator. The articles to be coated, such as for instance optical substrates, are mounted onto the rotating substrate support 17 which is insulated by means of insulators 18 against the apparatus. The passing through drive 19 for rotating support 14, is water cooled. The support for the substrate can be arranged to have a negative potential relative to the cathode by means of a voltage source 20.

If now the high vacuum apparatus 9 is put into operation an electron beam is led onto the surface of the target 1 by means of the electron gun and the pole shoes of the electromagnet 5. By means of such a point like spot of the material to be vaporized, the material is pre-melted on the surface on the target and this material is partly evaporated. By the impulse ionization of the evaporizing material with the electrons of the electron beam, a partial ionization of the vapor is produced. This ionization is sufficient for the ignition of the spark by a switching of a no-load voltage between the two electrodes of the spark, or between the target 1 and the anode 12. The jumping spark or arc, jumps, furthermore, onto the premelted, point-like spots on the surface of the target.

The electron beam gun 6 is preferably arranged in such a way in the high vacuum apparatus 9 that the electron beam can be randomly guided on the surface of the target 1. By this movement, the arc can also be arbitrarily guided on the surface of the target such that a more even and less sputtering evaporating of the material of the target is possible. By interrupting the arc a new spark is ignited automatically at the surface of the target by the point-like melting of the surface of the target and accordingly the arc is sustained.

The depositing of a coating on the substrate which is mounted on the substrate support 17 proceeds in accordance with generally known techniques.

It is quite obviously possible to arrange a laser in the high vacuum apparatus instead of the electron gun 6 wherewith now the surface of the target 1 is melted locally by a corresponding laser beam. Again, the igniting of the spark occurs by the requisite ionization of the vaporized material or, however, of the residual gas atmosphere in the charging chamber 21. Also when installing a laser in place of an electron beam gun it is possible to guide the corresponding spot on the surface of the target after the igniting of the arc by a guiding thereof in order to secure a more even and less sputtering erosion of the surface of the target.

The exemplary illustrated application of an electron beam gun in FIG. 1 is suitable for the igniting and guiding of a spark in any kind of vacuum apparatus.

EXEMPLARY EMBODIMENTS

EXAMPLE 1

A cubic evaporating apparatus of the type BAI 640K was equipped as follows: A water-cooled crucible was mounted into the bottom of the apparatus in a decentralized manner. Adjacent the crucible an electron beam gun having an axial magnetic field was mounted in the bottom of the apparatus. A cathode chamber of the apparatus was pumped off differentially and the distance between the exit of the electron beam and the center point of the cathode amounted to 100 millimeters. The electron beam gun had a maximal output of 8 kW. The crucible was made of copper, was water cooled and had a diameter of 80 millimeters. It was electrically insulated with respect to the bottom of the chamber and also with respect to the ground of the gun. It could be set into rotation by means of a motor. The crucible was connected by a cable which was led, in an insulated means into the apparatus, to the negative pole of a DC supply apparatus of the kind used as a welding transformer (max. 250 A) with copper cables of 10 millimeters. The positive pole of the supply apparatus was connected by a separate, electrically insulated and water-cooled throughput to a water cooled auxiliary anode. This anode was rectangular, 250×100 millimeters and stood like a flag at a distance of 60 millimeters from the crucible. A rotating disk was located opposite the bottom of the apparatus and had an axis extending through the center of the apparatus. Test specimens were arranged on the mentioned disk. The charge of the vessel were 350 g titanium and after charging the crucible the apparatus was closed and pumped off. The specimens were heated by a method commonly known for coatings of tools and their surfaces were cleaned in an argon plasma. Thereafter, the electron beam gun was switched on and its output was increased up to 700 watts. The voltage between the filament and the crucible was 10.6 kV. The crucible was made to rotate a 2 rpm. The focal spot with a diameter of about 1 millimeter was focussed on the sector of the vessel located closer to the exit opening of the electron beam. The pressure inside of the chamber was less than 0.002 Pa. Thereafter, the welding transformer was switched on. Its no-load voltage was 41 Volts. A annular groove formed in the melt of which the bottom corresponded to the foot point of the electron beam. A very bright plasma formed itself over this melt.

By means of an additional supply apparatus the substrates were brought to a voltage of −80 V against the potential of the crucible. The ion flow on the substrate support amounted to 8 amperes. Without the welding transformer the substrate current was too low to be measured. After 15 minutes the current supply was shut off and the apparatus flooded. A finely crystalline layer of 4 μm titanium was present on the substrates. The roughness of the surface of the test specimens remained unchanged and corresponded to a mean roughness depth of Ra, 0.04 μm.

EXAMPLE 2

The same structure as in the example 1 was used. The crucible was charged with 330 g titanium. Thereafter, initially the same procedure as in example 1 was followed. The output of the electron beam gun was controlled to 7.4 kW. The rotation of the crucible was not switched on. The electron beam was focussed to the center of the vessel. The diameter of the focal point was about 7 millimeters. The electron beam was wobbled by means of an automatic device with a frequency of 30 Hertz. Thereafter argon, and specifically 40 standard $cm^3$ per minute was led in. Thereafter, the welding transformer was switched on and its current was controlled up to 110 amperes. The voltage of operation was 10 volts. A very bright plasma formed again over the melt, which plasma followed the wobble movement. Nitrogen was then fed, and specifically 420 standard $cm^3$ per minute.

The substrates were subject to a DC-voltage of −20 volts. After one hour the power and gas supplies were shut off and the apparatus was opened. 8 μm stoichiometric golden coloured titanium-nitride was precipitated on the test disks. The hardness of the coating was 2300 HV. It displayed an excellent resistance against erosion. The process temperature did not exceed 222° Celsius.

EXAMPLE 3

A cubic vapor deposition apparatus of the type BAI 640K was equipped a follows: A water-cooled crucible was mounted decentralized in its bottom. An electron beam gun with an axial magnet field was mounted adjacent the crucible in the bottom. The cathode space was pumped off differentially. The distance between the exit of the electron beam and the center of the cathode amounted to 160 millimeters. The electron beam gun had a maximal output of 8 kW. The crucible was made of copper, was water-cooled and had a diameter of 80 millimeters. It was insulated electrically against the bottom of the chamber and the ground of the gun. It could be made to rotate by means of a motor. The vessel was connected by a cable which extended in an insulated manner into the apparatus to the negative pole of a DC supply apparatus of the kind used as a welding transformer (max. 250 A) with copper cables of 10 millimeters. The positive pole of the supply apparatus was connected by a separate, electrically insulated and water cooled throughput to a water cooled auxiliary anode. This anode was rectangular, 250×100 millimeters and stood like a flag at a distance of 60 millimeters from the vessel. Opposite the bottom, a calotte having plates was placed. The vessel was charged with 60 g silicon and the apparatus was closed and pumped off. Thereafter, oxygen was led into the chamber and its flow was controlled such that the pressure in the apparatus did not exceed 0.09 Pa. Thereafter, the electron beam gun was switched on and its output was increased up to 600 Watts.

About at the same time the crucible was set into rotating and the welding transformer was switched on. Its current was controlled to amount to 140 amperes. After 30 minutes the power supply was shut off. At the opening of the apparatus it was seen that a transparent silicon-oxide coating had been deposited on the glass panels.

EXAMPLE 4

Figure 2:
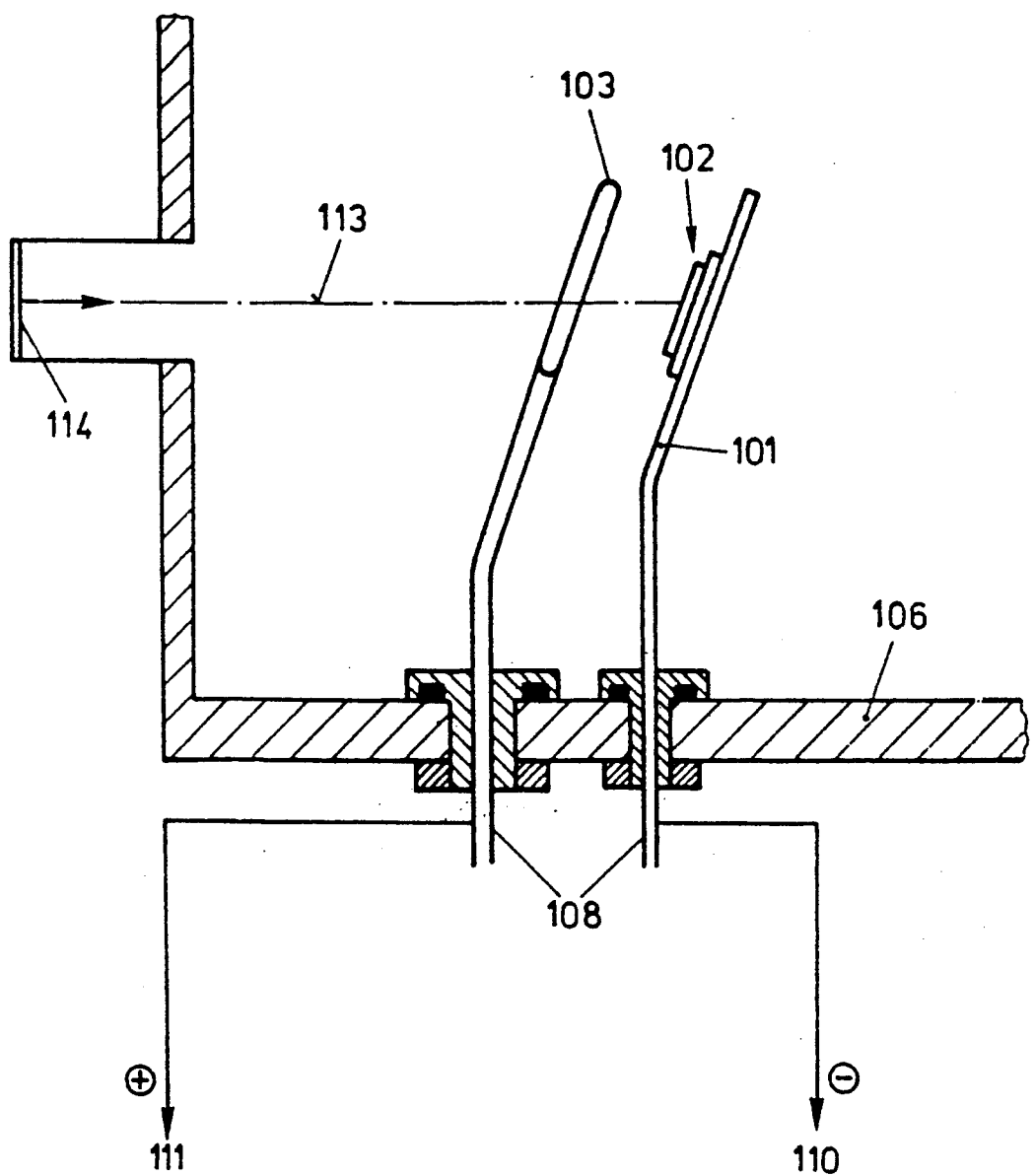
FIG. 2 illustrates a schematic of a principle arrangement of an inventive apparatus, suitable for practicing examples 4 and 5 herein.

Such as schematically illustrated in FIG. 2, a water-cooled, circular cathode support 101 (diameter 120 millimeters, thickness 10 millimeters) was mounted in a cubic apparatus BAI 760K at a distance of 200 millimeters from the center of the apparatus such, that the angle between the perpendicular line onto the surface and the axis of the plant amounted to 70°. A circular titanium target 102 (diameter 120 millimeters) having a thickness of 3 millimeters which was soldered onto a circular (60 mm diameter) copper block of a thickness of 12 millimeters was screwed on such, that it was possible to establish a good electrical contact between the titanium target and the cathode support. A water cooled (at 108) annular (inner diameter 70 millimeters) anode 103 having a circular cross-section (diameter 12 millimeters) was mounted parallel to the cathode, whereby the distance between the cathode and the anode was 35 millimeters and the anode extended in an insulated manner 13 through the bottom 106 of the apparatus. The cathode was grounded and connected to the negative pole 110 of a welding transformer (max. 250 amps), the anode 103 was connected to the positive pole 111 of this power source. The laser beam 113 of a pulsed Nd:YAG laser (500 W) was led through a window 114 (diameter 40 millimeters) which at both sides was coated by a antireflection layer into the apparatus and focussed through the anode onto the surface of the cathode. The distance between the window and the cathode was 280 millimeters. The laser beam was deflected by 90° outside of the apparatus by means of a rotating di-electric mirror 112 of which the surface formed an angle of 0.5° with the axis of rotation 122. By means of this rotation it was possible to rotate the focal point, i.e. spot (diameter 0.7 millimeters) of the laser beam on the titanium target. The speed of rotation could be adjusted between 0 and 6000 rpm. The focussing was made by means of a biconvex lens 116 coated at both sides by an antireflex material and having a focal length of 500 millimeters located in front of the rotating mirror.

After reaching $2*10^{-3}$ Pa the power supply apparatus was switched on and a voltage of 100 V established between the cathode and the anode. Thereafter, the spark was ignited by means of a laser pulse of a duration of 6 milliseconds and an energy of 30.5 joules. Thereafter, the not guided spark ran at about 20 Volts and 90 amps. It has been discovered, that the condition of ignition (threshold energy of the laser pulse) depends strongly on the surface condition of the target (ability of reflection) and on the rotational speed of the laser beam.

The time interval between pulses can be selected such that the bottom discharge burns continuously. This allows a guiding of the spark on the surface of the cathode. Instead of the mirror, it is also possible to use other optical elements, such as concave mirrors or screens. Instead of the Nd:YAG laser it is also possible to use gas or semiconductor lasers.

EXAMPLE 5

In a cubic apparatus BAI 760K a water cooled, circular cathode support (diameter 120 millimeters, thickness 10 millimeters) was mounted at a distance of 200 millimeters from the center of the apparatus, that the angle between the perpendicular line on the surface and the axis of the apparatus so amounted to 70°. A rectangular tin target which was soldered onto a copper plate having a thickness of 5 millimeters was screwed onto this cathode support 50 that a good electrical contact could be established between the tin target and the cathode support. At a distance of 35 millimeters from the cathode an anode was mounted which extended in an insulated manner through the bottom of the apparatus, was water cooled and of an annular (inner diameter 70 mm) shape having a circular cross-section (diameter 12 millimeters), which anode was arranged parallel to the cathode.

The cathode (and accordingly the tin target) was grounded and connected to the negative pole of a welding transformer (max. 250 amps). The anode was connected to the positive pole of this power source. The laser beam of a pulsed Nd:YAG lasers (500 Watts) was led through a window (diameter 40 millimeters) which at both sides was coated by a anti-reflecting layer into the apparatus and focussed through the anode onto the surface of the cathode. The distance between the window and the cathode amounted to 280 millimeters. The focussing of the laser beam was made by a lense (focus 500 millimeters) covered at both sides with a anti-reflection layer. The movement of the focussed laser beam with an area of 50 millimeters diameter on the target was accomplished in that the laser was mounted outside of the apparatus onto a massive table which could be moved in two directions independent from each other.

After reaching $2*10^{-3}$ Pa argon was fed into the vacuum chamber until a pressure of $2*10^{-1}$ Pa was reached. By switching on the power supply apparatus a voltage of 100 Volts was established between the cathode an the anode. The spark was ignited by means of a laser pulse of a duration of 6 milliseconds and an energy of 2 joules and ran on the tin target.

Thereafter, the spark ran at about 20 volts and 90 amps. It was seen that the condition of ignition (threshold energy of the laser pulse) depended strongly on the condition of the surface of the target (capability of reflection) and, evidentially, from the rotational speed of the laser beam.

EXAMPLE 6

In a cubic apparatus BAI 760K a cathode support was mounted at a distance of 200 millimeters from the center of the apparatus, which cathode support was water cooled and had a circular shape (diameter 120 millimeters, thickness 10 millimeters) and such that the angle between the perpendicular line onto the surface and the axis of the apparatus amounted to 70°. A round tungsten target (diameter 30 millimeters) of a thickness of 5 millimeters was clamped onto this cathode support so that a good electrical contact between the tungsten target and the cathode support was established. At a distance of 35 millimeters from the cathode an anode, which extended in an insulated manner through the bottom of the apparatus, was water cooled and of an annular (inner diameter 70 millimeters) shape with a circular cross-section (diameter 12 millimeters), was mounted parallel to the cathode.

The cathode was grounded and connected to the negative pole of a welding transformer (max. 250 amps). The anode was connected to the positive pole of this power supply source. The laser beam of a pulsed Nd:YAG laser (500 watts) was led through a window (diameter 40 millimeters) which at both sides was coated by an anti-reflection layer into the apparatus and focussed through the anode onto the surface of the cathode. The distance between the window and the cathode amounted to 280 millimeters. The focussing of the laser beam (diameter of the laser beam onto the target: 0.65 millimeters) proceeded by a biconvex lense (focus 500 millimeters) mounted outside of the apparatus and coated at both sides by a anti-reflection material, which lens could be arbitrarily moved on the tungsten target. The controlling of the movement was computer controlled. After reaching $2*10^{-3}$ Pa the power supply apparatus was switches on and a voltage of 100 Volts established between the cathode and the anode. Thereafter, the spark was ignited by means of a ladder shaped impulse of a total duration of 5 milliseconds and an energy of 7.5 joules. The spark was recorded by a storage cathode beam oscilloscope.

By means of a procedure similar to the one of example 4 and 5 the spark could be guided continuously.

While there have been shown and described present preferred embodiments of the invention it shall be distinctly understood that the invention is not limited to same and can be variously embodied and practiced within the scope of the following claims.

We claim:

1. An apparatus for vaporizing material under vacuum conditions by means of an arc, and with a target which includes at least at a part of its surface, a material to be vaporized, comprising:

means for wiring the target as cathode of an arc evaporator of the cathode spot type wherein an arc discharge burns on the material to be vaporized at a small defined spot on the material;

means for forming an arc discharge and for directing the arc discharge onto an area of the material, and where a substantial part of an arc current from the means for wiring flows mostly through the small spot on the material;

means for creating a beam directed toward the target for locally melting the material of the target and thus producing a local vapor cloud on the surface of the target near the spot, the means for creating the beam being spaced from the means for forming the arc discharge, the beam being in addition to the arc discharge and the spot following the local melting; and means for guiding the beam over the surface of the target in order to stabilize and guide movement of the spot as it follows the local melting and the vapor cloud.

2. The apparatus of claim 1, wherein said means for creating a beam comprises a laser, the beam comprising a laser beam, the means for guiding comprising an object lens through which the laser beam passes, and means for displacing the object lens for moving the small spot formed by the laser beam on the material to be vaporized, in a guided periodically moving manner on the surface of the target.

3. The apparatus of claim 1, wherein said means for creating a beam comprises a laser for creating a laser beam, the means for guiding comprising a moveable mounted mirror for deflecting the laser beam onto the material to be vaporized at the small spot, for guiding and moving the small spot on the surface of the target.

4. The apparatus of claim 1, wherein the means for guiding comprises means for displacing the target to move in a periodic repeating manner so that the small spot moves on the surface of the target.

5. The apparatus of claim 1, wherein the means for creating a beam comprises a laser for creating a laser beam including lens means for focusing the laser beam onto the small spot, the lens means having a focal length exceeding 40 millimeters.

6. The apparatus of claim 5, wherein the laser comprises a pulsed laser for igniting the arc.

7. A method of vaporizing material in a vacuum by means of an arc at a target wired as a cathode, which target includes at least at a portion of its surface, a material to be vaporized, the method comprising:

forming an arc discharge within an area where a substantial part of an arc current of the discharge flows mostly through a small spot at the surface of the target which is wired as a cathode, for defining a footprint;

forming a local vapor cloud by means of a beam at the surface of the target, wherein the footprint follow the cloud, the beam being created at a location spaced from the arc discharge; and stabilizing the footprint of the arc, by guiding the beam to control the vapor cloud to be over the footprint.

8. The method of claim 7, comprising the production of a puddle below the vapor cloud on the surface of the target.

9. The method of claim 8, wherein the surface of the target consists a melting material and the beam is defocussed to such an extent that the puddle around the base point of the arc forms continuously a funnel into which further liquid target material flows continuously wherewith the arc is stabilized without any guiding.

10. The method of claim 7, in which the beam is guided on the surface of the target.

11. The method of claim 7, in which at a mean time span an output of the arc exceeds the output of the beam.

12. The method of claim 7, in which an energy density of the beam is controlled such that a discharge current of more than 10 amperes at a discharge voltage of merely 10 to 15 volts is made possible.

13. The method of claim 7, in which an atmosphere of an inert gas, oxygen, nitrogen, a gaseous carbon compound, a metal-organic gaseous compound or a compound containing boron is maintained in the vaporization space located above the target.

14. The method of claim 7 wherein the beam comprises an electron beam or a laser beam having a focal point, and wherein the movement of the electron beam or the laser beam focal point proceeds with such speed that the movement proper of the footprint of the arc discharge is suppressed.

15. The method of claim 11, including a substrate in the vacuum and means for utilizing the vaporized material in a vapor depositing by plasma arc on to the substrate.

16. The method of claim 15 including providing an atmosphere in the vacuum selected from the group consisting of nitrogen, oxygen and a gaseous carbon compound, so that the vaporized material reacts with the atmosphere and condenses on the substrate in the form of a coating selected from the group consisting of carbides, oxides and nitrites.

* * * * *